US010424933B2

(12) United States Patent
Narla et al.

(10) Patent No.: US 10,424,933 B2
(45) Date of Patent: Sep. 24, 2019

(54) AUTOMATIC SMART TRANSFER SWITCH FOR ENERGY GENERATION SYSTEMS

(71) Applicant: SolarCity Corporation, San Mateo, CA (US)

(72) Inventors: Sandeep Narla, San Jose, CA (US); Andrew Russell Lutkus, Martinez, CA (US)

(73) Assignee: Tesla, Inc., Palo Alto, CA (US)

( * ) Notice: Subject to any disclaimer, the term of this patent is extended or adjusted under 35 U.S.C. 154(b) by 181 days.

(21) Appl. No.: 15/281,039

(22) Filed: Sep. 29, 2016

(65) Prior Publication Data

US 2018/0048159 A1 Feb. 15, 2018

Related U.S. Application Data

(60) Provisional application No. 62/373,264, filed on Aug. 10, 2016.

(51) Int. Cl.

| | |
|---|---|
| ***H02J 3/38*** | (2006.01) |
| ***H01L 31/042*** | (2014.01) |
| ***H02S 10/20*** | (2014.01) |
| ***H02S 40/30*** | (2014.01) |
| ***H02J 3/28*** | (2006.01) |

(52) U.S. Cl.

CPC ............ *H02J 3/383* (2013.01); *H01L 31/042* (2013.01); *H02J 3/28* (2013.01); *H02S 10/20* (2014.12); *H02S 40/30* (2014.12); *Y02E 10/563* (2013.01); *Y02E 10/566* (2013.01); *Y02E 70/30* (2013.01)

(58) Field of Classification Search

CPC ........ H02J 7/00; H02J 7/35; H02J 7/04; H02J 7/0052; H02J 7/0068; H02J 3/38; H02J 3/382; H02J 3/383; H02J 3/386; H02M 7/44; H02M 7/08; H02M 7/537; H02M 3/04

USPC ............ 307/70, 66, 64, 43, 80, 82; 320/108, 320/109, 120

See application file for complete search history.

(56) References Cited

U.S. PATENT DOCUMENTS

| | | | | |
|---|---|---|---|---|
| 9,312,724 | B2 | 4/2016 | Estes | |
| 9,876,360 | B2 * | 1/2018 | Kravitz | H02M 7/003 |
| 2008/0203820 | A1 * | 8/2008 | Kramer | H02J 3/38 307/64 |
| 2013/0285453 | A1 | 10/2013 | Hurst et al. | |

(Continued)

*Primary Examiner* — Fritz M Fleming
*Assistant Examiner* — Jagdeep S Dhillon
(74) *Attorney, Agent, or Firm* — Kilpatrick Townsend & Stockton LLP

(57) ABSTRACT

Embodiments disclose solar energy generation systems with automatic smart transfer switches. An energy generation system includes an array of PV modules, a PV inverter coupled to the array of PV modules, and a battery pack configured to store DC power from the PV modules and output the stored DC power. The energy generation system can further include a storage inverter/hybrid inverter PCS coupled to the battery pack, and an automatic smart transfer switch configured to select between an AC grid and the storage inverter/hybrid inverter PCS for outputting to a main electrical panel, where the automatic smart transfer switch is configured so that in a first position, the AC grid is coupled to the main electrical panel, and in a second position, both the storage inverter is coupled to the main electrical panel.

20 Claims, 9 Drawing Sheets

(56) References Cited

U.S. PATENT DOCUMENTS

| | | | | |
|---|---|---|---|---|
| 2014/0265585 | A1* | 9/2014 | Della Sera | H02J 3/38<br>307/52 |
| 2014/0266289 | A1 | 9/2014 | Della sera et al. | |
| 2016/0176305 | A1* | 6/2016 | James | H02J 3/383<br>307/26 |
| 2016/0226252 | A1* | 8/2016 | Kravtiz | H02M 7/003 |
| 2017/0201098 | A1* | 7/2017 | Carpenter | H02J 7/35 |
| 2018/0076624 | A1* | 3/2018 | Gudgel | H02J 3/382 |
| 2018/0076625 | A1* | 3/2018 | Gudgel | H02J 3/382 |
| 2018/0076626 | A1* | 3/2018 | Gudgel | H02J 3/387 |
| 2018/0076663 | A1* | 3/2018 | Gudgel | H02J 3/387 |

* cited by examiner

AUTOMATIC SMART TRANSFER SWITCH FOR ENERGY GENERATION SYSTEMS

CROSS-REFERENCES TO RELATED APPLICATIONS

This application claims the benefit of U.S. Provisional Application No. 62/373,264, filed on Aug. 10, 2016, which is incorporated by reference herein.

BACKGROUND

In recent years, climate change concerns, reduction in costs, governmental initiatives, and other factors have driven a rapid rise in the adoption of renewable energy generation systems (i.e., systems that generate energy using renewable resources such as solar, wind, fuel cells, geothermal etc.) at residential and non-residential sites. Solar energy generation systems, in particular, have been very popular energy generation systems due to numerous advantages over other renewable sources.

Solar energy generation systems include photovoltaic (PV) modules that can generate power from the sun, and can provide the generated power to a utility grid or one or more loads. Some solar energy generation systems can store energy from the PV and/or utility grid in a battery for future use, and can receive power from the utility grid and re-route power to the one or more loads without having to use power generated from the sun or from energy stored in the battery.

Inverters in conventional solar energy generation systems typically operate at/produce power levels that are not high enough to power the entire set of loads in the main panel at a customer site. Accordingly, these inverters limit the amount of power provided by the AC grid to the set of loads during grid-tied (on-grid) mode. Additionally, in reduced power circumstances (e.g., when a black-out event occurs or when a relatively low power-rated inverter cannot output enough power to support the entire set of loads at a customer site) the PV system may only provide power to a subset of the entire set of loads (e.g., the loads designated as back-up loads). Accordingly, loads that are not back-up loads will not be able to receive power from the PV system and thus cannot be used.

SUMMARY

Various embodiments of the disclosure provide an automatic smart transfer switch for enabling the solar energy generation system to directly couple the AC grid to a main electrical panel so that the entire set of loads at a customer site can be serviced by the AC grid without being limited by the inverter in grid-tied (on-grid) mode. Additionally, various embodiments of the disclosure provide a smart main electrical panel for enabling the solar energy generation system to dynamically supply power to an entire set of loads.

In some embodiments, an energy generation system includes an array of photovoltaic (PV) modules for generating direct current (DC) power; a PV inverter coupled to the array of PV modules, the PV inverter is configured to convert the generated DC power to alternating current (AC) power and output the converted AC power; a battery pack configured to store DC power and output the stored DC power; a storage inverter coupled to the battery pack, the storage inverter is configured to convert the outputted stored DC power to AC power and output the converted AC power; and an automatic smart transfer switch configured to select between an AC grid and the storage inverter for outputting to a main electrical panel, where the automatic smart transfer switch is configured so that in a first position, the AC grid is coupled to the main electrical panel, and in a second position, both the storage inverter is coupled to the main electrical panel.

The automatic smart transfer switch can be configured to be in the first position when AC power from the AC grid is available, and automatically transfer to the second position in response to a loss of AC power from the AC grid. The automatic smart transfer switch can be configured to be in the second position when AC power from the AC grid is available and automatically transfer to the first position in response to a loss of AC power from the AC grid. In particular embodiments, the automatic smart transfer switch is powered by AC power from the AC grid. In other embodiments, the automatic smart transfer switch can be powered by AC power from the PV inverter. The automatic smart transfer switch can electrically isolate the PV inverter and the storage inverter when the automatic smart transfer switch is in the first position. The main panel can include connections for an entire set of loads at a customer site. In some embodiments, the entire set of loads at the customer site can include on-site loads and back-up loads. The automatic smart transfer switch may be disconnected from the AC grid when the automatic smart transfer switch is in the second position. In certain embodiments, the energy generation system may further include a sensor configured to detect a presence of voltage, frequency, or power from the AC grid; and a controller coupled to the sensor and the automatic smart transfer switch. The controller can be configured to operate the automatic smart transfer switch in the first position when the sensor detects that power from the AC grid is present and to transition the automatic smart transfer switch to the second position when the sensor detects that power from the AC grid no longer present.

In some embodiments, an energy generation system includes an array of photovoltaic (PV) modules for generating direct current (DC) power; a battery pack configured to store DC power and output the stored DC power; a PV inverter power control system (PCS) coupled to the array of PV modules and the battery pack, the PV inverter is configured to convert the DC power from the array of PV modules and the battery pack to alternating current (AC) power and output the converted AC power; and an automatic smart transfer switch configured to select between an AC grid and the PV inverter PCS for outputting to a main panel, where the automatic smart transfer switch is configured so that in a first position, the AC grid is coupled to the main panel, and in a second position, the PV inverter PCS is coupled to the main panel.

The automatic smart transfer switch may be configured to be in the first position when AC power from the AC grid is available, and automatically transfer to the second position in response to a loss of AC power from the AC grid. The automatic smart transfer switch may be configured to be in the second position when AC power from the AC grid is available, and automatically transfer to the first position in response to a loss of AC power from the AC grid. The automatic smart transfer switch can be powered by AC power from the AC grid. In certain embodiments, the automatic smart transfer switch can be powered by AC power from the hybrid PV inverter PCS. The automatic smart transfer switch can bypass the PV inverter PCS when the automatic smart transfer switch is in the first position. The main panel can include connections for an entire set of loads at a customer site. The entire set of loads at the customer site can include on-site loads and back-up loads.

The automatic smart transfer switch can be disconnected from the AC grid when the automatic smart transfer switch is in the second position. In certain embodiments, the energy generation system may further include a sensor configured to detect a presence of voltage, frequency, or power from the AC grid; and a controller coupled to the sensor and the automatic smart transfer switch. The controller can be configured to operate the automatic smart transfer switch in the first position when the sensor detects that power from the AC grid is present and to transition the automatic smart transfer switch to the second position when the sensor detects that power from the AC grid no longer present.

A better understanding of the nature and advantages of embodiments of the present invention may be gained with reference to the following detailed description and the accompanying drawings.

DETAILED DESCRIPTION

Solar energy generation systems according to embodiments of the disclosure can directly couple a utility grid to loads at an installation site. In such energy generation systems, an automatic smart transfer switch can be implemented between the inverter and both the utility grid and the loads at the installation site. The automatic smart transfer switch can be configured to select between the inverter and the utility grid to connect to the loads at the installation site. When the automatic smart transfer switch selects the utility grid to connect to the loads during on-grid mode, the utility grid may be directly connected to the loads while the off-grid output of the inverter is isolated. Thus, the inverter cannot limit the power provided to the loads by the utility grid during on-grid mode, but can still feed energy from PV and/or battery to the AC grid during off-grid mode. This is unlike conventional energy generation systems that limit the power provided by the utility grid, as will be discussed further herein.

I. PV Systems

A conventional solar energy generation system includes an energy generation device, e.g., an array of PV modules connected together on one or more strings, for generating DC power from the sun, one or more PV string inverters for converting the DC power from the strings to AC power, and physical interfaces for feeding into the utility grid and/or off-grid outputs—typically on the load side of the utility meter, between the meter and the customer's main electrical panel. The conventional solar energy generation system provides excess AC power/energy back to the utility grid, resulting in cost benefits to the customer or resulting in a source of grid services. The conventional solar energy generation system can also route power from the utility grid to one or more loads through the inverter at the customer site separated in a back-up load panel. Conventional solar energy generation systems, however, limit the amount of power provided by the utility grid to all of the loads or the backed-up loads at the customer site, as the power passes through the inverter limited by the power ratings of the inverter's internal components. There are two types of conventional energy generation systems: an AC-coupled energy generation system and a DC-coupled energy generation system.

Figure 1:
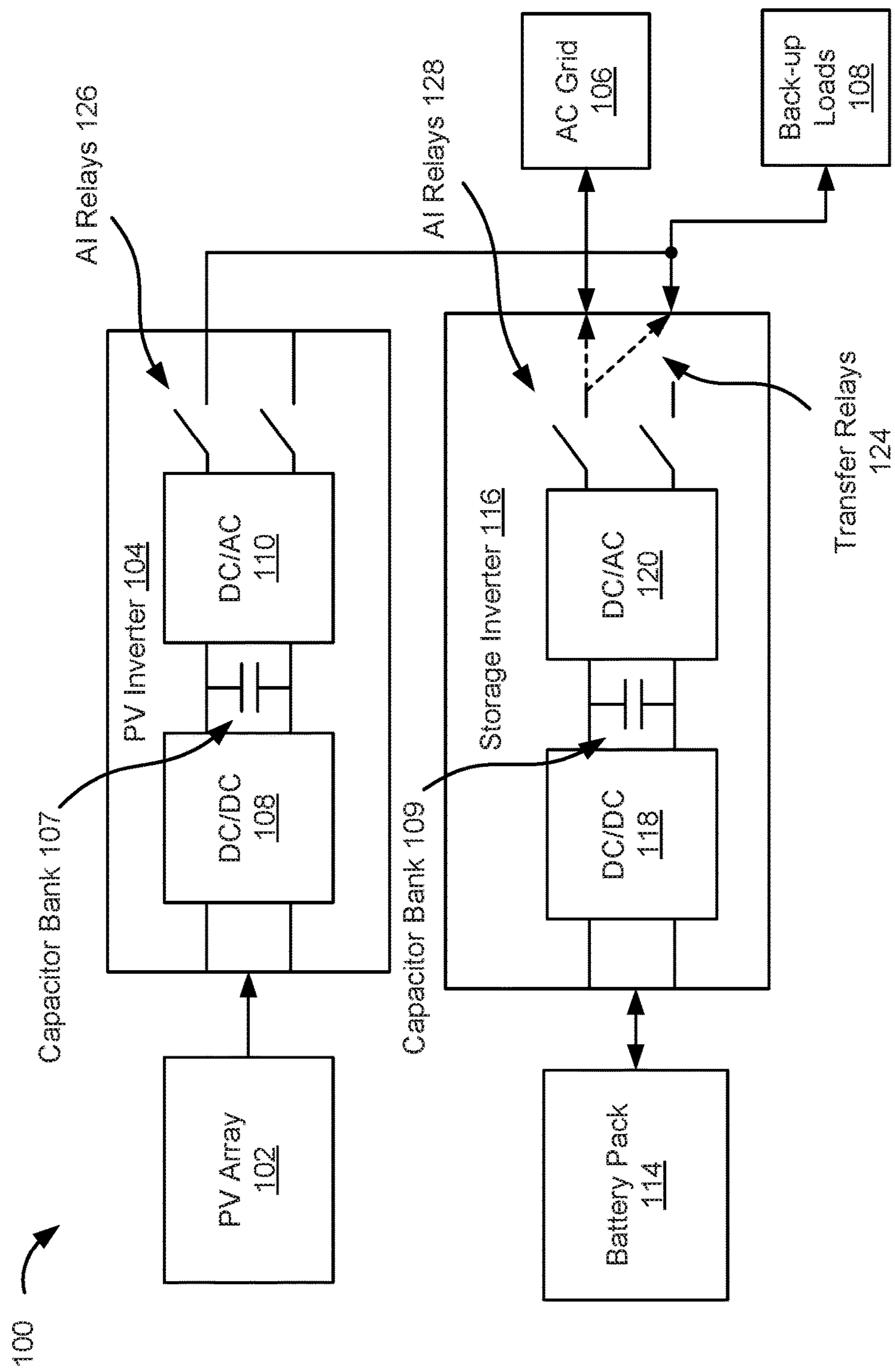
FIG. 1 is a block diagram illustrating a conventional AC-coupled energy storage system.

FIG. 1 illustrates a block diagram of conventional AC-coupled energy storage system 100. The energy generation system is called an AC-coupled energy generation system because a PV inverter and a storage inverter are coupled at the AC side of each inverter. As shown, AC-coupled energy storage system 100 is a PV system that includes PV array(s)/strings 102 for generating DC power and PV grid-tied string inverter 104 for converting the generated DC power to AC power for feeding into AC utility grid 106 at the interface for back-up loads 108. PV array 102 may be a single PV module or one or more array/string of PV modules capable of generating DC voltage from photons emitted from a light source such as the sun. Inverter 104 may include DC-to-DC (buck and/or boost) converter 108 for stepping up/down the received DC power from PV array 102 to a suitable level for inversion, and DC-to-AC inverter 110 for converting the DC power to AC power for outputting to AC grid 106. Inverter 104 may also include capacitor bank 107 coupled between power lines routing power from DC-to-DC converter 108 to DC-to-AC inverter 110 for power stabilization purposes. In some embodiments, the DC-to-DC conversion may take place on the roof in the form of PV optimizers. In certain embodiments where strings of PV modules are long enough to provide high voltage sufficient for conversion on their own, only a DC-to-AC inverter may be implemented in PV system 100. The micro-inverter may include a DC-to-DC converter and a DC-to-AC inverter, and may be installed on the roof instead of PV string inverter 104.

PV system 100 may also include battery pack 114 for storing and discharging power/energy. Battery pack 114 may be any lead-acid or advanced lead-acid or lithium-ion or flow battery or organic battery pack and the like. Power discharged from battery pack 114 may be provided to storage inverter 116, which may include DC-to-DC converter 118 for stepping up/down DC voltage provided by battery pack 114 to a suitable level for inversion during charging/discharging processes. DC-to-DC converter 118 may be a buck and/or boost converter that is implemented when battery pack 114 does not include a separate DC-to-DC buck and/or boost converter. In some embodiments, DC-to-DC converter 118 may still be required in storage inverter 116 if the DC-to-DC buck and/or boost converter inside battery pack 114 is not sufficient to match the conversion voltage of storage inverter 116. Storage inverter 116 may also include DC-to-AC inverter 120 for converting the DC power from battery pack 114 to AC power for outputting to AC grid 106 or one or more back-up loads 108. Storage inverter 116 may also include capacitor bank 109 coupled between power lines routing power from DC-to-DC converter 118 to DC-to-AC inverter 120 for power stabilization purposes. Anti-islanding relays 126 and 128 may be implemented within PV inverter 104 and storage inverter 116, respectively, to direct power between inverters 104 and 116 and AC grid 106. Transfer relays 124 may be implemented within storage inverter 116 to direct power between inverter 116 and either AC grid 106 or back-up loads 108. In various embodiments, when transfer relays 124 are in a first position, storage inverter 116 may provide power to or receive power from AC grid 106, and when transfer relays are in a second position, storage inverter 116 may provide power to back-up loads 108 in off-grid (voltage source) operation, e.g., when the utility grid is not available. In the second position, the PV inverter may provide AC power to the storage inverter to charge the battery through the back-up loads interface.

Figure 2:
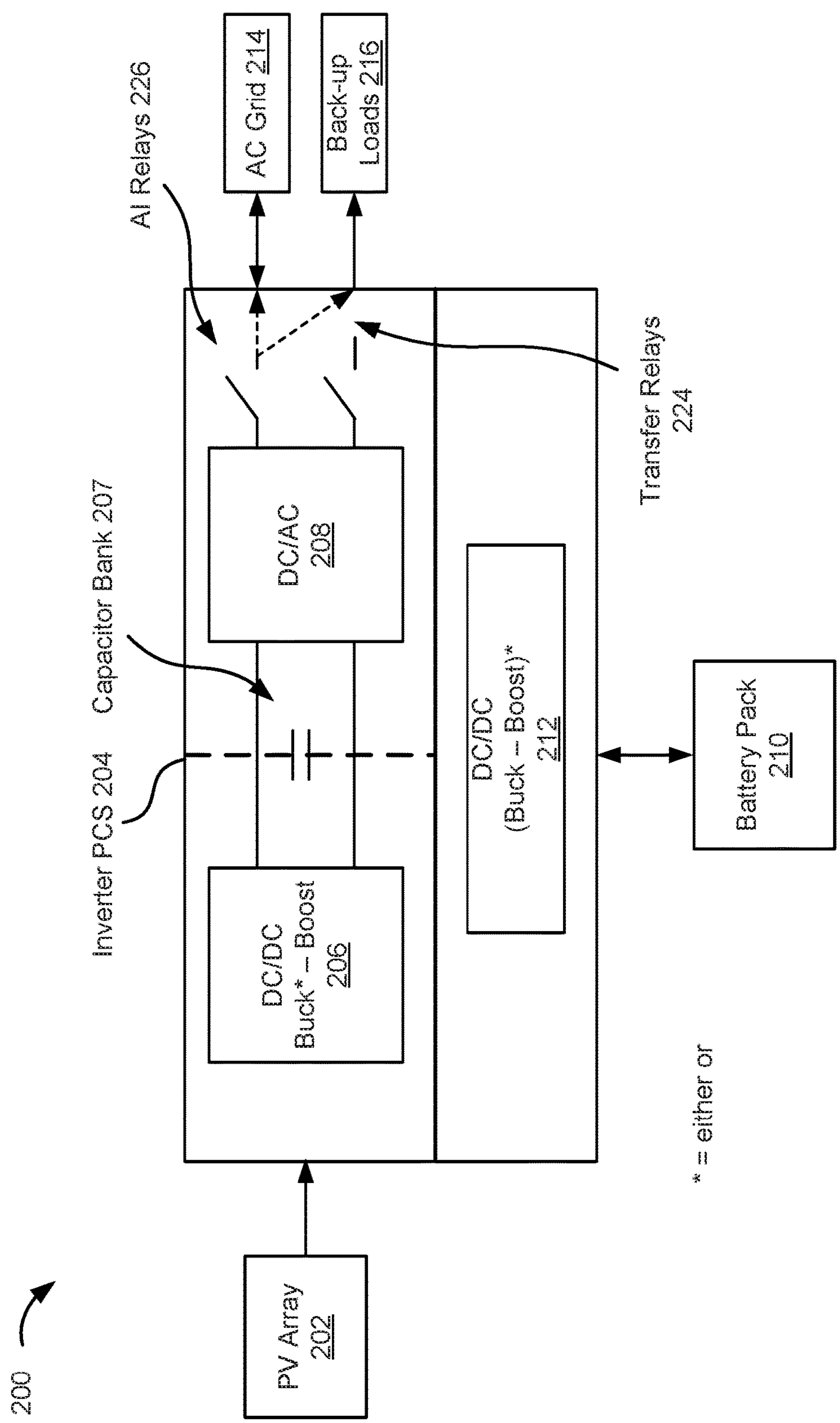
FIG. 2 is a block diagram illustrating a conventional DC-coupled energy storage system.

Another newer type of conventional PV system is a DC-coupled energy storage system as shown in FIG. 2, which illustrates a block diagram of conventional DC-coupled energy storage system 200. This energy generation system is called a DC-coupled energy generation system because a battery pack and a PV array are coupled to the DC side of an inverter. DC-coupled energy storage system 200 is a PV system that includes PV array(s)/string(s) 202 for generating DC power and inverter power control system (PCS) 204 for converting the generated DC power to AC power for outputting to AC grid 214 or back-up loads 216. Instead of having two separate inverters, as shown in FIG. 1, system 200 may only have a single inverter PCS that is configured to control the flow of power between DC sources, e.g., PV array 202 and battery pack 210, and AC output destinations, e.g., AC grid 214 and back-up loads 216. Similar to transfer relays 124 in FIG. 1, transfer relays 224 may determine which output destination will receive power from inverter PCS 204. In various embodiments, when transfer relays 224 are in a first position, inverter PCS 204 may provide power to or receive power from AC grid 214, and when transfer relays 224 are in a second position, inverter PCS 204 may provide power to back-up loads 216. Anti-islanding relays 226 may be implemented within PV inverter PCS 204 to direct power from/to AC grid 214.

Inverter PCS 204 may include DC-to-DC (buck and/or boost) converter 206 for ensuring that the voltage provided to DC-to-AC inverter 208 is sufficiently high for inversion. In some embodiments, the DC-to-DC conversion may take place on the roof in the form of PV optimizers. In certain embodiments where strings of PV modules are long enough to provide high voltage sufficient for conversion on their own, only a DC-to-AC inverter may be implemented in PV system 200. Inverter PCS 204 also includes a DC link bus attached to battery pack 210 so that the DC power coming from PV array 202 can be used to deliver DC power to battery pack 210. The DC link bus is represented by capacitor bank 207 shown between the two DC-to-DC converters 206 and 212 and DC-to-AC inverter 208 in FIG. 2. Battery pack 210 may have a minimum and maximum associated operating voltage window. Because battery pack 210 has a maximum exposed input voltage limit that, in many cases, may be lower than the theoretical maximum DC voltage coming off of the strings (open circuit voltage), a buck-boost circuit 206 or 212 may be implemented between the string-level PV input of inverter PCS 204 and the DC-link connection to battery pack 210. The inclusion of buck-boost circuit 206 or 212 will prevent battery pack 210 from being exposed to voltages above a safe threshold, thereby eliminating the possibility of damage to battery pack 210 from overvoltage stress. For instance, when DC-to-DC converter 206 is only a boost converter, then DC-to-DC converter 212 may be a buck-boost converter for preventing battery pack 210 from overvoltage stress and provides flexibility in operating voltage range. However, if DC-to-DC converter 206 is a buck and boost converter, then DC-to-DC converter 212 may not be needed. Further details of energy generation system 200 can be referenced in U.S. patent application Ser. No. 14/798,069, filed on Jul. 13, 2015, entitled "Hybrid Inverter Power Control System for PV String, Battery, Grid and Back-up Loads," where is herein incorporated by reference in its entirety for all purposes Back-up loads, e.g., back-up loads 108 and 216 in FIGS. 1 and 2, respectively, discussed herein above may be an entire set, or a subset of the entire set, of loads for a customer site. For instance, back-up loads may be certain loads that are considered to be more important that other loads during power outage. As an example, for a residential customer site, back-up loads may be a refrigerator, air conditioning unit, heater unit, and other loads important for human survival, whereas loads that are not considered back-up loads—but are still part of the entire set of loads—include a television set, a desk lamp, a nightstand light, and the like. For a commercial customer site, back-up loads may be a server bay, information technology infrastructure devices, and other loads important for business sustainability during a power outage, whereas loads that are not considered back-up loads 108 and 216 may be hallway lights, bathroom lights, desk lamps, and the like. In some embodiments, back-up loads may be included in a main panel (not shown) that houses connections for the entire set of loads for a customer site. In other embodiments, back-up loads may be included in a separate load panel (not shown) beside the main panel.

Inverters in solar energy generation systems typically operate at power levels that are high enough to provide a sufficient amount of power for all/some of the back-up loads but not high enough to power the entire set of loads at a customer site. These operating power levels are lower than the levels that can be provided by the AC grid and thus limit the amount of power provided by the AC grid to the set of loads during grid-tied (on-grid) mode. For instance, during on-grid mode when AC power is available from the AC grid, the AC power is first provided to the inverter, e.g., storage inverter 116 and PV inverter PCS 204 in FIGS. 1 and 2, respectively, and then relayed through the inverter to the back-up loads. Because power to the back-up loads needs to go through the inverter, the amount of power provided by the AC grid to the back-up loads is limited by the operating current/power limits of the storage inverter/inverter PCS which are limited by the ratings of the storage inverter/inverter PCS internal components like switches, relays, wiring, and the like.

II. PV Energy Generation System with an automatic Smart Transfer Switch

According to embodiments of the present disclosure, a solar energy generation system is implemented with an automatic smart transfer switch for enabling the solar energy generation system to directly couple the AC grid to a main electrical panel so that the entire set of loads at a customer site can be serviced by the AC grid without being limited by the inverter in grid-tied (on-grid) mode. During on-grid mode (e.g., when power is being provided by the AC grid), the automatic smart transfer switch may isolate the inverter AC back-up (off-grid) output so that the power from the AC grid can be directly provided to the entire set of loads at the customer site. During this time, the output power of the inverter to the AC grid may still be active. During off-grid mode (e.g., when power is not available from the AC grid, such as when a blackout/outage occurs), the automatic smart transfer switch may disconnect the main electrical panel from the AC grid and connect the main panel to the inverter AC back-up (off-grid) output to receive power from either the PV modules and/or the battery in the solar energy generation system.

Figure 3:
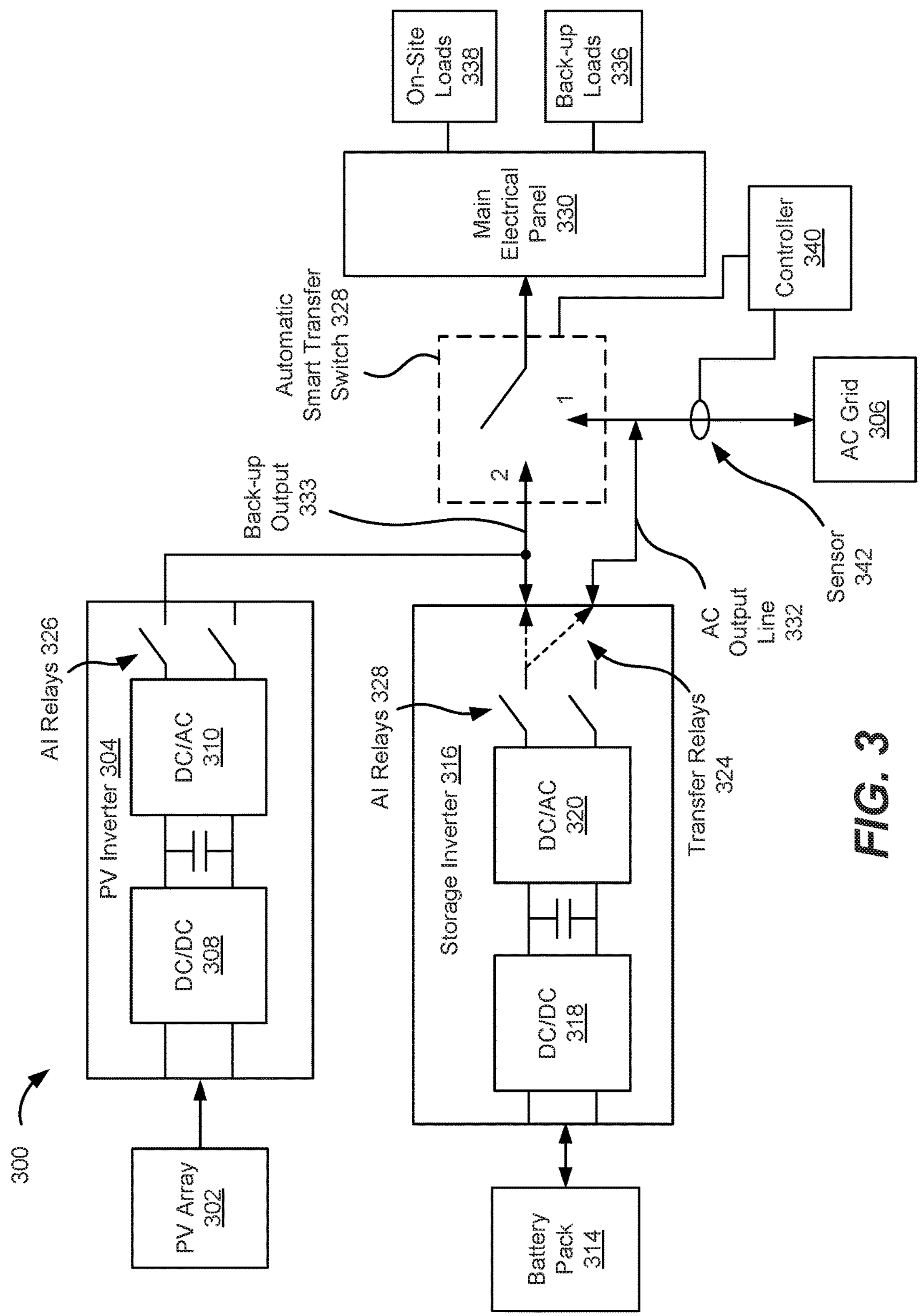
FIG. 3 is a block diagram illustrating an exemplary AC-coupled solar energy generation system with an automatic smart transfer switch, according to some embodiments of the present disclosure.

FIG. 3 illustrates exemplary AC-coupled solar energy generation system 300 with automatic smart transfer switch 328, according to embodiments of the present disclosure. Energy generation system 300 includes PV array 302 for generating DC power and PV inverter 304 for receiving the generated DC power and converting the generated DC power to AC power. Additionally, energy generation system 300 includes a battery pack 314 for storing power from or providing power to storage inverter 316. Battery pack 314 may include one or more battery cells, a battery management system (BMS), a DC-to-DC buck and/or boost converter, or any combination thereof. According to embodiments of the present disclosure, automatic smart transfer switch 328 may be positioned to route power between storage inverter 316 and both main electrical panel 330 and AC grid 306. For instance, automatic smart transfer switch 328 may be positioned between inverter 316 and both main electrical panel 330 and AC grid 306. Main electrical panel 330 may be a physical interface from which an entire set of loads may receive power from inverter 316 or AC grid 306. The entire set of loads include back-up loads 336 and other on-site loads 338, which may include those loads that are not considered to be back-up loads. In some embodiments, there may be multiple PV inverters and/or multiple storage inverters and/or multiple battery packs possible for providing more back-up power and/or energy to the loads in main electrical panel 330 or utility grid.

Automatic smart transfer switch 328 may be configured to select between two inputs for connecting to an output. For example, automatic smart transfer switch 328 may select between inverter 316 and AC grid 306 to connect to main electrical panel 330 for providing power to loads at a customer site. As shown in FIG. 3, automatic smart transfer switch 328 may have two positions: position 1 and position 2. Depending on the position of automatic smart transfer switch 328, main electrical panel 330 may be coupled to inverter 316 or AC grid 306. In some embodiments, the switch may have three positions, where the third position is such that main electrical panel 330 is completely isolated (e.g., not connected to any component). In certain embodiments, automatic transfer switch 328 may also be operated as a manual switch. In some embodiments, when there are multiple storage inverters and/or batteries, the switch may combine or have more positions for multiplexing (combining) the total power/energy from multiple inverters in order to power more loads in the main electrical panel.

For instance, when automatic smart transfer switch 328 is in position 1, AC grid 306 may be coupled to main electrical panel 330 to provide power to main electrical panel 330. Unlike conventional solar energy generation systems that limit the power provided by an AC grid by routing power from the AC grid to back-up loads through an inverter, solar energy generation system 300 may instead connect AC grid 306 directly to main electrical panel 330 without having to go through inverter 316. Accordingly, the power from AC grid 306 may be provided to the entire loads set in the main electrical panel 330 so that both back-up loads 336 and on-site loads 338 may receive sufficient power without any impedance from inverter 316.

In additional embodiments, storage inverter 316 also does not limit the power provided by AC grid 306 to main electrical panel 330 even though storage inverter 316 may be coupled to AC grid 306 through AC output/input line 332. The direct connection between AC grid 306 and main electrical panel 330 allows power to bypass storage inverter 316 and directly flow from AC grid 306 to main electrical panel 330 to power back-up loads 336 and on-site loads 338. In some embodiments, AC output/input line 332 provides an avenue through which power may flow to battery pack 314 for storing energy from AC grid 306.

When AC grid 306 is no longer available, such as when a blackout/outage occurs, automatic smart transfer switch 328 may move to position 2 where inverters 304 and 316 connect with main electrical panel 330 through AC back-up output 333 so that power generated from PV array 302 and/or power provided by battery pack 314 may be used to power the entire set of loads/proportional loads coupled to main electrical panel 330. Automatic smart transfer switch 328 may disconnect main electrical panel 330 from AC grid 306 when it is in position 2. Because PV inverter 304 and storage inverter 316 operate at power levels insufficient for powering all loads set in main electrical panel 330, i.e., both on-site loads 338 and back-up loads 336 at the same time, only back-up loads 336, or any other portion of the entire set of loads in main electrical panel 330, may receive power when automatic smart transfer switch 328 is in position 2.

According to embodiments of the present disclosure, automatic smart transfer switch 328 may be in a default position when AC grid 306 is present, and transfer to an alternative position when AC grid 306 is no longer available. The transitioning between the default position and the alternative positon may occur automatically and in response to the absence of voltage from AC grid 306.

As an example, automatic smart transfer switch 328 may be in position 1 when AC grid 306 is present. Position 1 may be a default position of automatic smart transfer switch 328 when AC grid 306 is present. When AC grid 306 is not available, automatic smart transfer switch 328 may automatically transfer to position 2, thereby allowing power to be provided to the entire set of loads in main electrical panel 330, i.e., both back-up loads 336 and on-site loads 338, from PV array 302 and/or battery pack 314. Position 2 may be an alternative position of automatic smart transfer switch 328, the alternative position being a position of automatic smart transfer switch 328 when no external factors are present. The transition may occur automatically upon the loss of AC grid 306. In some embodiments, automatic transfer switch 328 is powered by AC grid 306 so that when AC grid 306 is available, power can be provided to automatic smart transfer switch 328 to keep it in position 1; and when AC grid 306 is not available, power can no longer be provided to automatic smart transfer switch 328 to keep it in position 1 and thus causes automatic smart transfer switch 328 to transition to its alternative position, i.e., position 2. In such instances, automatic smart transfer switch 328 may be an N-pole dual-throw relay, or switch, or contactor that is spring loaded to be in the alternative position when power is not present. In some embodiments, the automatic transfer switch 428 can be powered from the back-up output of the inverter PCS, and the operational logic for positions 1 and 2 would be opposite to the above embodiment.

In another example, the position of automatic smart transfer switch 328 may be designated by a separate device, such as controller 340. Controller 340 may be coupled to sensor 342 to detect the presence of AC grid 306 and designate the position of automatic smart transfer switch 328 based on whether AC grid 306 is present. For instance, controller 340 may cause automatic smart transfer switch 328 to be in position 1 when controller 340 detects the presence of AC grid 306; and may cause automatic smart transfer switch 328 to be in position 2 when controller 340 detects that the presence of AC grid 306 is lost. The presence/loss of AC grid 306 may be detected when a voltage, frequency, or power is sensed/not sensed by sensor 342. Controller 340 may be positioned within its own separate enclosure, or within main electrical panel 330, storage inverter 316, or PV inverter 304. Controller 340 may be any suitable device capable of being configured to manage the operation of automatic smart transfer switch 328, such as a microcontroller, application specific integrated circuit (ASIC), field-programmable gate array (FPGA), and the like. Sensor 342 may be any suitable sensor, such as a voltage sensor, for detecting the presence of AC grid 306. In such embodiments, automatic smart transfer switch 328 may be an N-pole dual-throw electronically-controlled relay.

Figure 4:
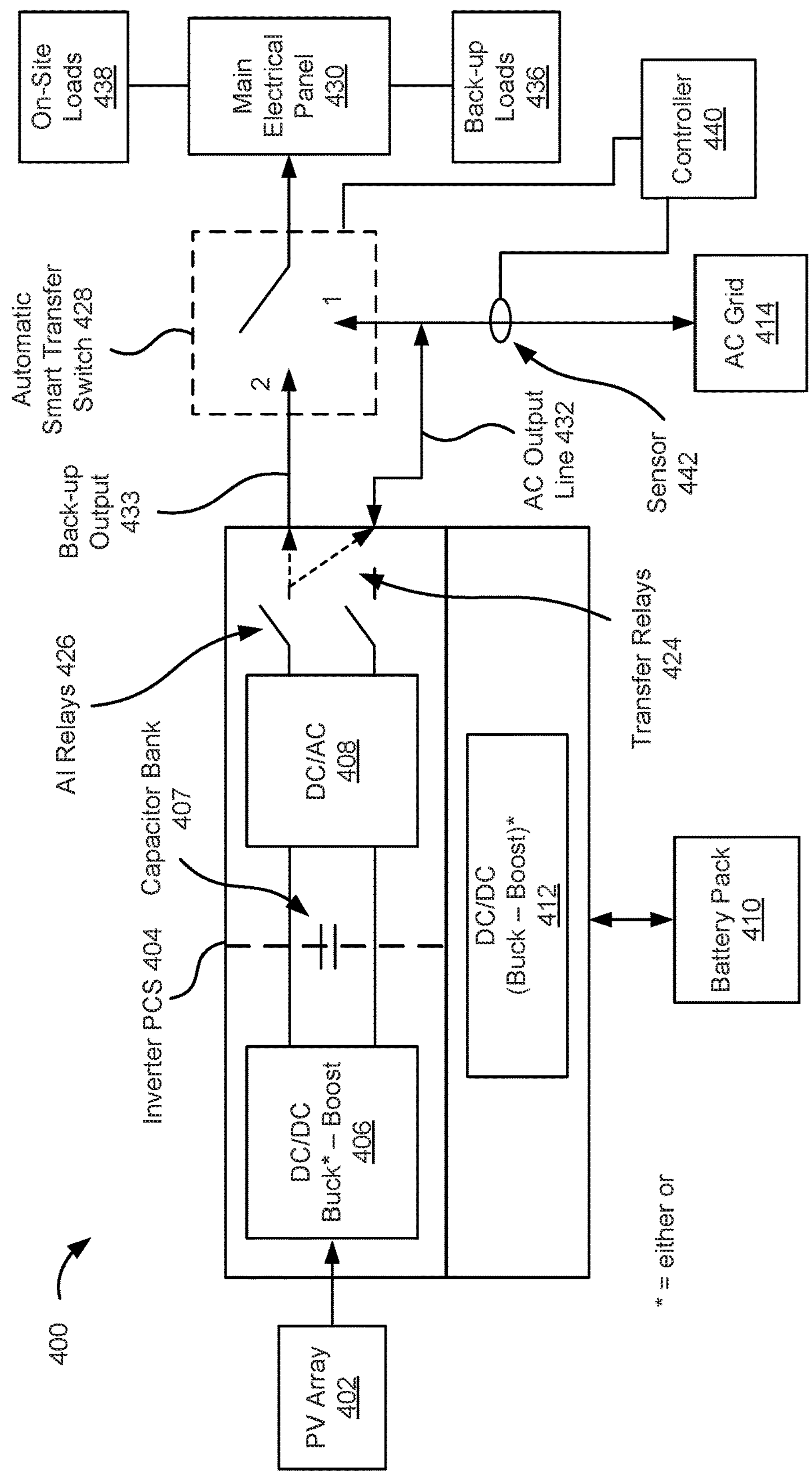
FIG. 4 is a block diagram illustrating an exemplary DC-coupled energy storage system with an automatic smart transfer switch, according to some embodiments of the present disclosure.

Automatic smart transfer switches discussed herein with respect to FIG. 3 may not only be implemented in AC-coupled energy storage systems, but also for DC-coupled energy storage systems, as discussed herein with respect to FIG. 4. FIG. 4 illustrates a block diagram of exemplary DC-coupled energy storage system 400 with automatic smart transfer switch 428, according to embodiments of the present disclosure. Energy generation system 400 includes PV array 402 for generating DC power and inverter PCS 404 for receiving the generated DC power and converting the generated DC power to AC power. Additionally, energy generation system 400 includes battery pack 410 for storing power from and/or providing power to PV inverter PCS 404. In some embodiments, there may be additional inverter PCSs and/or additional battery packs for providing more back-up power and/or energy to the loads in main electrical panel 430. In some embodiments, energy storage system 400 may also include a PV inverter or a storage inverter in combination with inverter PCS 404. Battery pack 410 may include one or more battery cells, a battery management system (BMS), a DC-to-DC buck and/or boost converter, or any combination thereof. In some embodiments, there may be multiple PV inverters and/or multiple storage inverters and/or inverter PCSs and/or multiple battery packs possible for providing more back-up power and/or energy to the loads in main electrical panel 430.

According to embodiments of the present disclosure, energy generation system 400 includes automatic smart transfer switch 428 that is positioned to route power between inverter PCS 404 and both main panel 430 and AC grid 414. Main electrical panel 430 may be a physical interface from which an entire set of loads may receive power from inverter PCS 404 or AC grid 414. The entire set of loads include back-up loads 436 and on-site loads 438, which include those loads that are not considered to be back-up loads.

Similar to automatic smart transfer switch 328 in FIG. 3, automatic smart transfer switch 428 may be configured to select between two inputs for connecting to an output. For example, automatic smart transfer switch 428 may select between inverter PCS 404 and AC grid 414 to connect to main panel 430 for providing power to loads at a customer site. Automatic smart transfer switch 428 may have two positions: position 1 and position 2. Depending on the position of automatic smart transfer switch 428, main panel 430 may be coupled to inverter PCS 404 or AC grid 414. In some embodiments, automatic smart transfer switch 428 may have three positions, where the third position is such that main electrical panel 430 is completely isolated (e.g., not connected to any component). In certain embodiments, automatic transfer switch 428 may also be operated as a manual switch.

When automatic smart transfer switch 428 is in position 1, AC grid 414 may be coupled to main electrical panel 430 to provide power to main electrical panel 430. In embodiments, AC grid 414 may be directly coupled to main panel 430 so that power may be provided to main panel 430 from AC grid 414 without having to go through inverter PCS 404. Accordingly, the full potential of power from AC grid 414 may be provided to main panel 430 so that both back-up loads 436 and on-site loads 438 may receive sufficient power without hindrance from inverter PCS 404 in grid-tied mode (on-grid). According to embodiments, inverter PCS 404 does not limit the power provided by AC grid 414 to main electrical panel 430. The direct connection between AC grid 414 and main panel 430 allows power to bypass inverter PCS 404 and directly flow from AC grid 406 to main panel 430 to power back-up loads 436 and on-site loads 438.

Similar to automatic smart transfer switch 328 in FIG. 3, automatic smart transfer switch 428 may automatically move to position 2 when AC grid 414 is no longer available, e.g., when a blackout occurs. In position 2, automatic smart transfer switch 428 may couple inverter PCS 404 to main panel 430 through its AC back-up output 433 so that power generated from PV array 402 and/or power provided by battery pack 410 may be used to power loads coupled to main panel 430. Because PV inverter PCS 404 operates at power levels insufficient for powering both on-site loads 438 and back-up loads 436 at the same time, only back-up loads 436 may receive power when automatic smart transfer switch 428 is in position 2 or a portion of the entire set of loads, i.e., a portion of both back-up loads 438 and on-site loads 438, may receive power in position 2.

Position 2 may be an alternative position for automatic smart transfer switch 428, and position 1 may be a default position. Thus, when AC grid 414 is not available, automatic smart transfer switch 428 may automatically transfer to position 2, thereby allowing power to be provided to the entire set of loads on main electrical panel 430 i.e., back-up loads 436 and on-site loads 438 from PV array 402 and/or battery pack 410. The transition may automatically occur upon the loss of AC grid 414. In some embodiments, automatic transfer switch 428 is powered by AC grid 414 so that when AC grid 414 is available, power can be provided to automatic smart transfer switch 428 to keep it in position 1; and when AC grid 414 is not available, power can no longer be provided to automatic smart transfer switch 428 to keep it in position 1 and thus causes automatic smart transfer switch 428 to transition to its alternative position, i.e., position 2. In some embodiments, the automatic transfer switch 428 can be powered from the output of the inverter PCS for the back-up loads, and the logic for positions 1 and 2 would be opposite to the above embodiment. In some embodiments, when there are multiple inverter PCSs and/or battery packs, the switch may combine or have more positions for multiplexing the total power/energy from multiple inverters in order to power more loads in the main electrical panel.

In other embodiments, the position of automatic smart transfer switch 428 may be designated by a separate device, such as controller 440. Controller 440 may be coupled to sensor 442 to detect the presence of AC grid 414 and designate the position of automatic smart transfer switch 428 based on whether AC grid 414 is present. For instance, controller 440 may cause automatic smart transfer switch 428 to be in position 1 when controller 440 detects the presence of AC grid 414; and may cause automatic smart transfer switch 428 to be in position 2 when controller 440 detects that the presence of AC grid 414 is lost. Controller 440 may be positioned within its own separate enclosure or within main panel 430 or in inverter PCS 404. Similar to controller 340 in FIG. 3, controller 440 may be any suitable device capable of being configured to manage the operation of automatic smart transfer switch 428, such as a microcontroller, application specific integrated circuit (ASIC), field-programmable gate array (FPGA), and the like for receiving sensor information and for performing computations. Controller 440 may communicate via wired or wireless communication lines to inverter 404 and main electrical panel 430. And similar to sensor 342 in FIG. 3, sensor 442 may be any suitable sensor for detecting the presence of AC grid 414.

Similar to automatic smart transfer switch 328 in FIG. 3, automatic smart transfer switch 428 may be an N-pole dual throw relay, or switch, or contactor that is spring loaded to be in an alternative position when power is not present, or an N-pole dual-throw electronically-controlled relay.

It is to be appreciated that PV inverter 304, storage inverter 316, and inverter PCS 404 in FIGS. 3 and 4 can be any type of inverter for any phase grid. As an example, inverters 304, 316, and 404 may be single phase inverters for operating with a single phase utility grid and single phase loads. In other examples, inverters 304, 316, and 404 may be multi-phase inverters for operating with a multi-phase utility grid and multi-phase loads. In some embodiments, at least one of inverters 304, 316, and 404 is a three-phase inverter for operating in a three-phase power system including a three-phase and/or multi-phase loads.

III. PV Energy Generation Systems with a Smart Main Electrical Panel

As discussed herein, conventional PV systems, e.g., PV systems 100 and 200 in FIGS. 1 and 2, respectively, can provide power to back-up loads for a customer site. The back-up loads may include circuits that use power, such as a refrigerator, a washer/dryer, an air conditioning unit, and the like. The power lines that provide power to the circuits are hardwired to an electrical panel at the customer site and not easily reconfigured.

In reduced power circumstances (e.g., when a black-out event occurs or when a low power-rated inverter cannot output enough power to support the entire set of loads at a customer site) the PV system may only provide power to a subset of the entire set of loads (e.g., the loads designated as back-up loads). Accordingly, loads that are not back-up loads will not be able to receive power from the PV system and thus cannot be used.

According to embodiments of the present disclosure, a solar energy generation system is implemented with a smart main electrical panel for enabling the solar energy generation system to dynamically supply power to an entire set of loads. Being able to dynamically supply power means being able to adjust which circuits are to receive power in real time. For instance, the smart main electrical panel can dynamically adjust power flow to different loads at the customer site in response to power demand. This enables the smart main electrical panel to provide power to all of the circuits at the customer site, thereby eliminating the need for having to designate a set of back-up loads or a separate load panel. In some embodiments, the smart main electrical panel may be able to reconfigure distribution of power according to one or more circuit breaker profiles and/or a priority list. Each circuit breaker profile may be a predetermined set of circuits that are to be connected to the PV and storage system to receive power. Being able to adjust which circuits are to receive power in real time allows the PV and storage system to supply power to the entire set of loads in a piecemeal fashion, even though the output power is not sufficient to supply power to the entire set of loads at the same time. This also eliminates possibility of overload situations.

Figure 5:
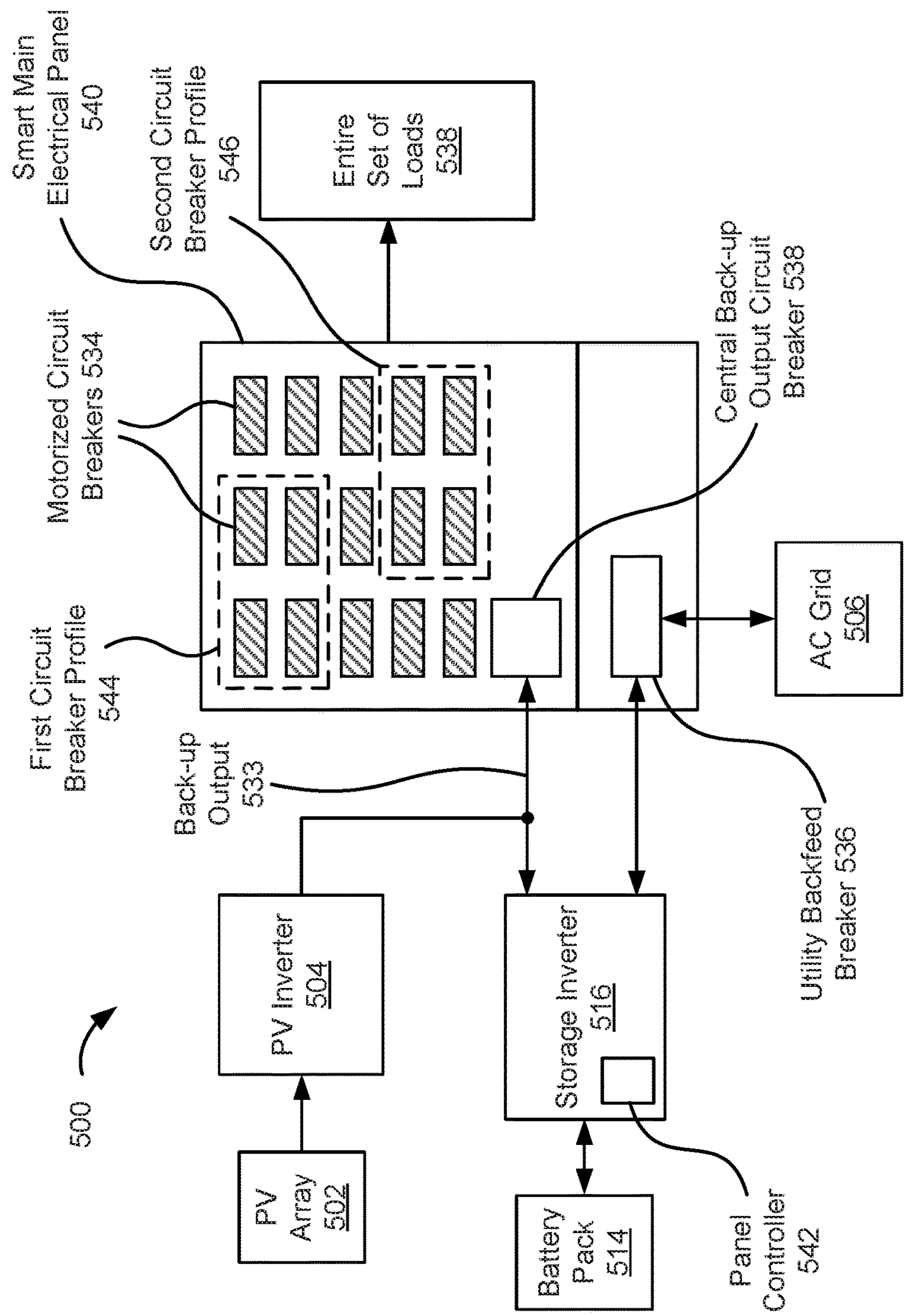
FIG. 5 is a block diagram illustrating an exemplary AC-coupled solar energy generation system with a smart main electrical panel, according to some embodiments of the present disclosure.

FIG. 5 illustrates exemplary AC-coupled solar energy generation system 500 with smart main electrical panel 540, according to embodiments of the present disclosure. Energy generation system 500 includes PV array 502 for generating DC power and PV inverter 504 for receiving the generated DC power and converting the generated DC power to AC power. Additionally, energy generation system 500 includes battery pack 514 for storing power from or providing power to storage inverter 516. Battery pack 514 may include one or more battery cells, a battery management system (BMS), a DC-to-DC buck and/or boost converter, or any combination thereof. PV inverter 504 and storage inverter 516 may be configured similar to the respective components of PV inverter 104 and storage inverter 116 in FIG. 1. In some embodiments, there may be multiple PV inverters and/or multiple storage inverters and/or multiple battery packs for providing more back-up power and/or energy to entire set of loads 538. Entire set of loads 538 may include all of the circuits operated at the customer site, such as an air conditioning unit, refrigerator, lamps, recessed lights, consumer electronics, and the like, without designation between on-site and back-up loads.

Smart main electrical panel 540 may be a physical interface to which entire set of loads 538 may couple to receive power from storage inverter 516 or AC grid 506. Smart main electrical panel 540 may include interfaces for entire set of loads 538, thus PV system 500 does not need a separate back-up panel in addition to the smart main electrical panel 540. According to some embodiments of the present disclosure, smart main electrical panel 540 may include a plurality of motorized circuit breakers 534 for coupling respective circuits in entire set of loads 538 to storage inverter 516 or AC grid 506.

In general, conventional circuit breakers are electrical switches designed to protect an electrical circuit from damage caused by overload or short circuit. Its function is to interrupt power flow after a default is detected. Generic circuit breakers can be manually reset by hand to resume the power flow, and may also be manually switched to interrupt power flow if desired. Switching of these circuit breakers requires a person to manually switch the position of the circuit breakers. Unlike generic circuit breakers, however, motorized circuit breakers 534 according to embodiments of the present disclosure may be remotely reset without direct manual interaction by a person. For instance, a mechanical device may be coupled to a circuit breaker switch and configured to move the circuit breaker switch to reset or interrupt the power flow. According to some embodiments of the present disclosure, more than one motorized circuit breakers 834 can be remotely switched at a time to interrupt or establish power flow, as will be discussed further herein. In some embodiments, the motorized circuit breakers could be mechanical relays or contactors or mechanical switches.

In some embodiments, the switching of motorized circuit breakers 534 may be controlled by a controller, such as panel controller 542. Panel controller 542 can send electrical signals to specific motorized circuit breakers 534 to either interrupt or establish their power flow. In order for panel controller 542 to control motorized circuit breakers 534, wired or wireless communication lines (not shown for clarity purposes) may be coupled between panel controller 542 and each motorized circuit breaker 534. Any suitable wired communication lines, e.g., RS485, controller area network (CAN) bus, and the like, and any suitable wireless communication lines, e.g., wireless fidelity (WiFi), Zigbee, radio, and power line communication (PLC), can be used. A mobile application interface can, in some embodiments, enable a customer to command panel controller 542 to send electrical signals to the specific motorized circuit breakers 534. In certain embodiments, panel controller 542 may be any suitable device capable of being configured to control the switching of motorized circuit breakers 534. For example, panel controller 542 may be a microcontroller, ASIC, FPGA, and the like. Panel controller 542 may be positioned within storage inverter 516 as shown in FIG. 5; however, embodiments are not limited to such configurations. Panel controller 542 may be positioned within either of PV inverter 504 and smart main electrical panel 540 or in a separate external enclosure, as long as panel controller 542 can control motorized circuit breakers 534 according to embodiments of the present disclosure.

Panel controller 542 can be configured to switch a group of motorized circuit breakers 534 to a position that enables power flow. The group of motorized circuit breakers 534 may be determined by a circuit breaker profile. Exemplary PV system 500 in FIG. 5 shows two circuit breaker profiles: first circuit breaker profile 544 and second circuit breaker profile 546. Each circuit breaker profile includes a different predetermined group of motorized circuit breakers 534. In some cases, two circuit breaker profiles may have one or more motorized circuit breakers that are the same. In some embodiments, the circuit breakers could be single pole (for example: 110/120V), two-pole (for example: 208/220/230/240V), or multi-pole circuit breakers.

The selection of motorized circuit breakers 534 in each circuit breaker profile is based on a particular circumstance that it is designed to address. For instance, one circuit breaker profile, e.g, first circuit breaker profile 544, may be designed for instances where grid power is unavailable, such as during a black-out event. In such instances, first circuit breaker profile 544 may include a group of motorized circuit breakers 534 corresponding to circuits necessary for human survival. Thus, when a black-out event occurs, panel controller 542 may switch motorized circuit breakers 534 to enable power flow according to first circuit breaker profile 544. Panel controller 542 may, at the same time, switch all other motorized circuit breakers 534 to interrupt power flow.

Another circuit breaker profile, e.g., circuit breaker profile 546, may be for instances where there is limited grid or back-up power (e.g., due to a low power rating inverter as discussed herein with respect to FIG. 1, or for any other reason) and the customer wants to use a power-intensive entertainment system. In such cases, second circuit breaker profile 546 may include a group of motorized circuit breakers 534 that correspond to circuits for the operation of the entertainment system. Thus, when the customer indicates a desire to use the entertainment system, panel controller 542 may switch the group of motorized circuit breakers 534 to enable power flow according to second circuit breaker profile 546, and may, at the same time, switch all other motorized circuit breakers 534 to interrupt power flow. By only allowing power to flow to the entertainment system and interrupting power flow to other circuits not related to the entertainment system, the other circuits may not unnecessarily draw power and reduce the amount of power available to the entertainment system.

In some embodiments, panel controller 542 may independently control the switching of motorized circuit breakers 534 according to a circuit breaker profile. For example, panel controller 542 may include a memory bank (not shown) containing lines of computer code that, when executed, switches motorized circuit breakers 534 according to a selected circuit breaker profile determined by an algorithm. The algorithm may be created by a technician during manufacturing and/or during installation of PV system 500 or by the customer himself via a mobile application. In additional or alternative embodiments, panel controller 542 may be communicatively coupled to an external device that can send commands to panel controller 542 to switch motorized circuit breakers 534 according to a circuit breaker profile. As an example, a mobile device, such as a customer's smart phone, may send a command to panel controller 542 to switch specific motorized circuit breakers 534 according to a circuit breaker profile selected by the customer through the smart phone.

In additional embodiments, panel controller 542 may operate the switching of motorized circuit breakers 534 according to a priority list. Some circuits may have a higher priority than other circuits given the importance of the function of the circuit. Thus, motorized circuit breakers 534 corresponding to the circuits that have higher priorities may be switched to allow power flow over other motorized circuit breakers 534 corresponding to circuits that have lower priorities. For example, when a microwave oven or a stove is drawing power, motorized circuit breakers 534 for a washer and/or dryer can be switched in a position that interrupts power flow. Likewise, when the microwave or a stove is not drawing power, motorized circuit breakers 534 for the washer and/or dryer can be switched in a position that allows power flow. The list of priorities may be programmed within panel controller 542 by a technician during manufacturing or installation of PV system 500, or may be controlled by a customer after installation of PV system 500 via an external device.

Once the selected motorized circuit breaker profiles 534 are switched to allow power flow, power from storage inverter 516, PV inverter 504, and/or AC grid 506 may be provided to corresponding circuits of entire set of loads 538. In certain embodiments, during on-grid mode, all of the power from AC grid 506 first flows to storage inverter 516 and then flows to smart main electrical panel 540 before being outputted to loads 538. In some embodiments, power may flow from PV inverter 504 and/or storage inverter 516 as back-up output 533 to central back-up output circuit breaker 538. From there, power may then flow to motorized circuit breakers 534. Only those motorized circuit breakers 534 that are switched to allow power flow may enable power to flow from storage inverter 516 to the respective circuits in entire set of loads 538. In additional embodiments, power may flow from AC grid 506 to the respective circuits in entire set of loads 538 through the selected motorized circuit breakers 534. In such embodiments, power may first flow through utility back-feed breaker 536, storage inverter 516, central back-up output circuit breaker 538, and then to the respective circuits in entire set of loads 538.

As can be appreciated herein, energy generation systems that have smart main electrical panels can enable the solar energy generation system to supply power to a dynamic set of loads. Thus, the entire set of loads can be serviced by the energy generation system even in reduced power situations.

Figure 6:
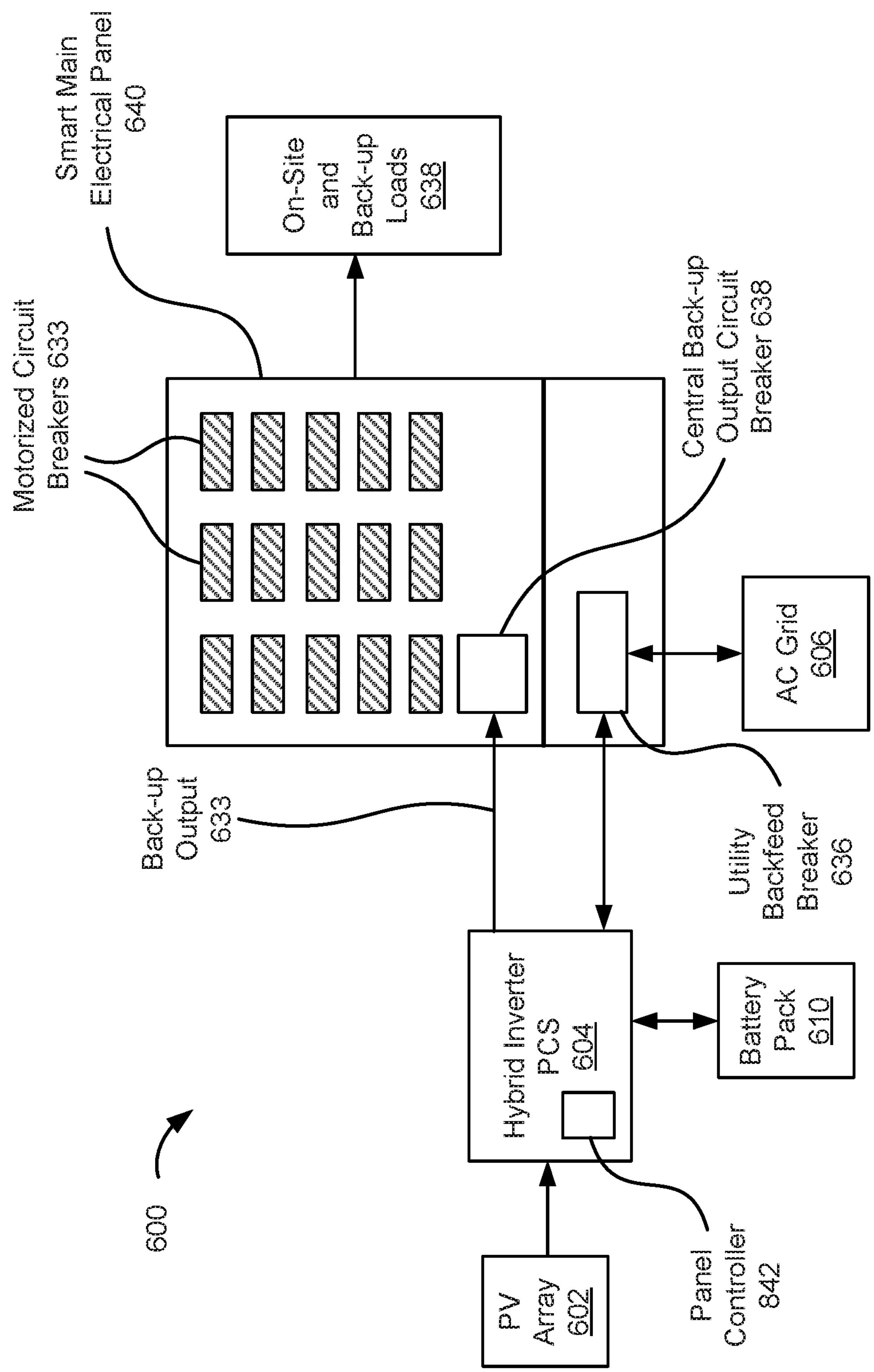
FIG. 6 is a block diagram illustrating an exemplary DC-coupled solar energy generation system with a smart main electrical panel, according to some embodiments of the present disclosure.

It is to be appreciated that a smart main electrical panel may be incorporated in conventional DC-coupled solar energy generation systems as well. For instance, FIG. 6 illustrates exemplary DC-coupled solar energy generation system 600 with smart main electrical panel 640, according to embodiments of the present disclosure. Energy generation system 600 includes PV array 602 for generating DC power, battery pack 610 for storing energy, and PV hybrid inverter PCS 604 for receiving the generated DC power and converting the generated DC power to AC power. Hybrid inverter PCS 604 may be similar in operation and construction to inverter PCS 204 in FIG. 2.

Smart main electrical panel 640 may be a physical interface from which entire set of loads 638 may receive power from hybrid inverter PCS 604 or AC grid 606. According to embodiments, smart main electrical panel 640 may include motorized circuit breakers 633 for remotely controlling the power flow to circuits in entire set of loads 638. Thus, in limited power situations, e.g., when a low power-rated inverter limits the amount of power provided by an AC grid, or when a black-out event occurs, smart main electrical panel 640 may dynamically adjust the power flow to those circuits in entire set of loads 638 that need power. Operations of smart main electrical panel 640 may be similar to the operations of smart main electrical panel 540 in FIG. 5.

While smart main electrical panels may be incorporated in conventional PV systems, it is to be appreciated that these smart main electrical panels may also be incorporated in any other suitable PV system. For instance, smart main electrical panels may also be incorporated into PV systems with automatic smart transfer switches, such as PV systems 300 and 400 discussed herein with respect to FIGS. 3 and 4 herein.

Figure 7:
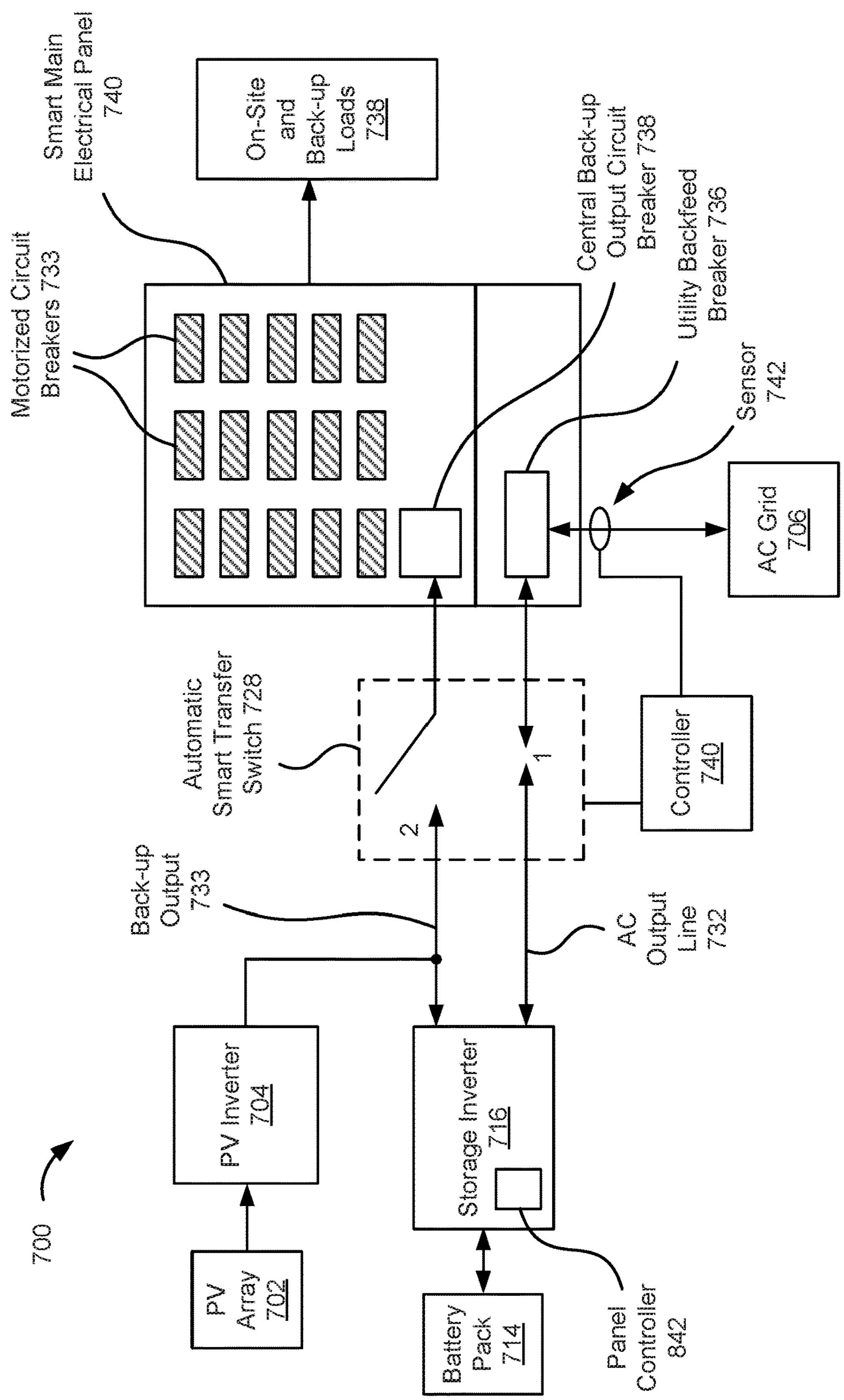
FIG. 7 is a block diagram illustrating an exemplary AC-coupled solar energy generation system with an automatic smart transfer switch and a smart main electrical panel, according to some embodiments of the present disclosure.

FIG. 7 illustrates a block diagram of exemplary AC-coupled solar energy generation system 700 with automatic smart transfer switch 728 and smart main electrical panel 740, according to embodiments of the present disclosure. Automatic smart transfer switch 728 may be positioned between storage inverter 716 and smart main electrical panel 740. In some embodiments, automatic smart transfer switch 728 transition between position 1 and position 2 so that power from AC grid 706 may not be limited by the power rating of storage inverter 716, for similar reasons discussed herein with respect to FIG. 3. Smart main electrical panel 740 may include motorized circuit breakers 733 for remotely controlling the power flow to circuits in entire set of loads 738. Thus, in limited power situations, e.g., when a black-out event occurs, smart main electrical panel 740 may dynamically adjust the power flow to those circuits in entire set of loads 738 that need power. Operations of smart main electrical panel 740 may be similar to the operations of smart main electrical panel 540 in FIG. 5.

When automatic smart transfer switch 728 is in position 1, storage inverter 716 may be electrically isolated so that power may flow from AC grid 706 directly to entire set of loads 738 through automatic smart transfer switch 728. In this case, all circuits in entire set of loads 738 may be supplied power from AC grid 706. However, when automatic smart transfer switch 728 is in position 2, such as when a black-out/outage event occurs, a limited amount of power may be provided to entire set of loads 738 from PV array 702 and/or battery pack 714. The limited amount of power may not be sufficient to support all of the circuits in entire set of loads 738. According to embodiments of the present disclosure, smart main electrical panel 740 may dynamically switch between circuit profiles to provide power to those circuits in entire set of loads 738 that currently need power, thereby enabling the entire set of loads at the customer site to be able to receive power from the energy generation system. Operation of smart main electrical panel 740 is similar to the operation of smart main electrical panel 540 discussed in FIG. 5. In some embodiments, when there is no AC grid available, panel controller 842 may use power from battery pack 714 or PV array 702 to operate motorized circuit breakers 733.

Figure 8:
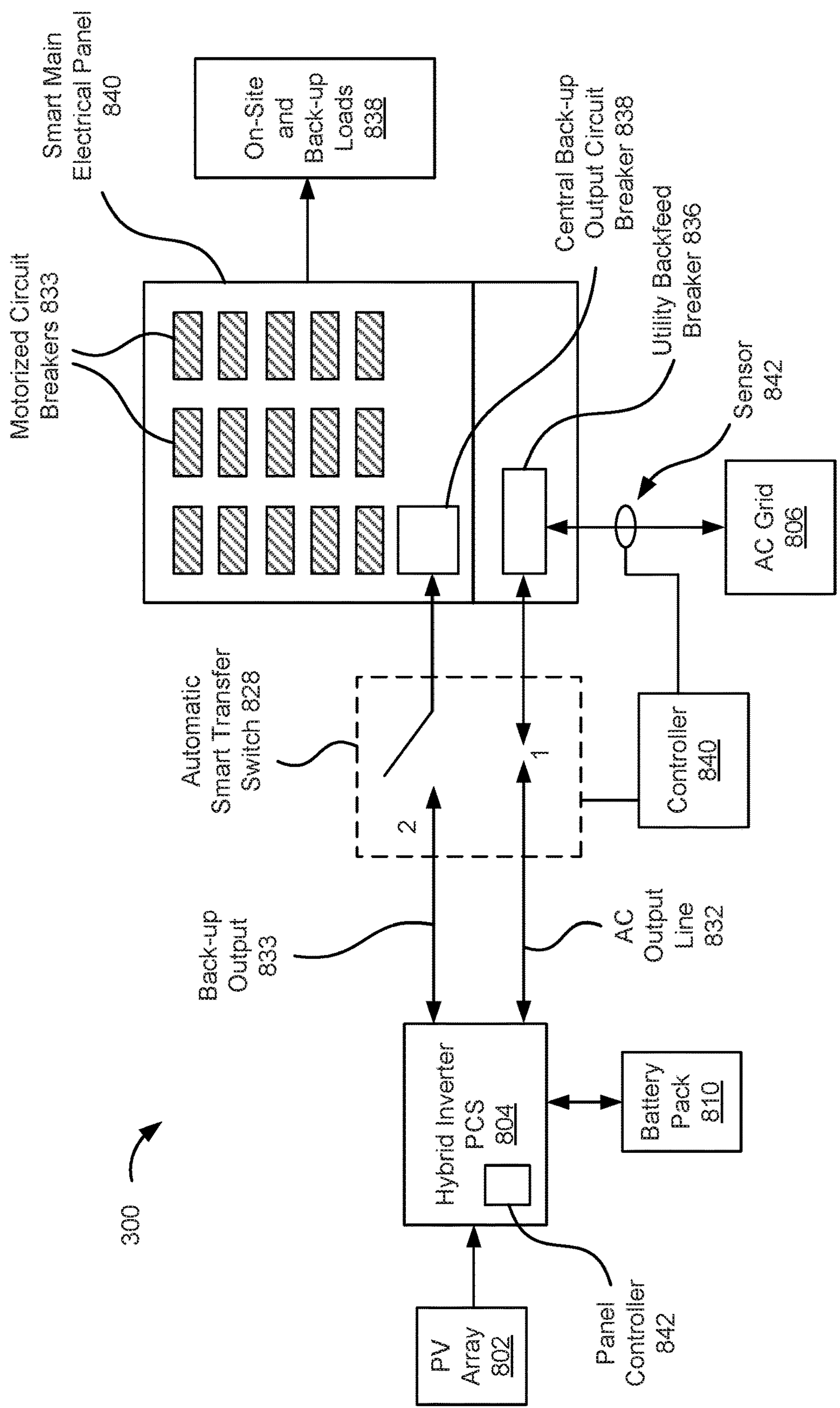
FIG. 8 is a block diagram illustrating an exemplary DC-coupled solar energy generation system with an automatic smart transfer switch and a smart main electrical panel, according to some embodiments of the present disclosure.

According to embodiments, smart main electrical panels may also be implemented in DC-coupled energy generation systems with automatic smart transfer switches. FIG. 8 illustrates a block diagram of exemplary DC-coupled solar energy generation system 800 with automatic smart transfer switch 828 and smart main electrical panel 840, according to embodiments of the present disclosure. Automatic smart transfer switch 828 may transition between position 1 and position 2 so that power from AC grid 806 may not be limited by the power rating of hybrid inverter PCS 804, for similar reasons discussed herein with respect to FIG. 4.

When automatic smart transfer switch 828 is in position 1, back-up output 833 of storage inverter 804 may be electrically isolated so that power may flow from AC grid 806 directly to entire set of loads 838 through automatic smart transfer switch 828. However, when automatic smart transfer switch 828 is in position 2, a limited amount of power may be provided to entire set of loads 838 from PV array 802 and/or battery pack 810. The limited amount of power may not be sufficient to support all of the circuits in entire set of loads 838. Thus, similar to smart main electrical panel 540 in FIG. 5, smart main electrical panel 840 may dynamically switch between circuit profiles to provide power to those circuits in entire set of loads 838 that currently need power, thereby enabling the entire set of loads at the customer site to be able to receive power from the energy generation system.

By implementing smart main electrical panels 740 and 840 in energy generation systems 700 and 800, respectively, power may be provided to all circuits in entire set of loads 838 even when limited power is provided by respective PV arrays and/or battery packs.

Figure 9:
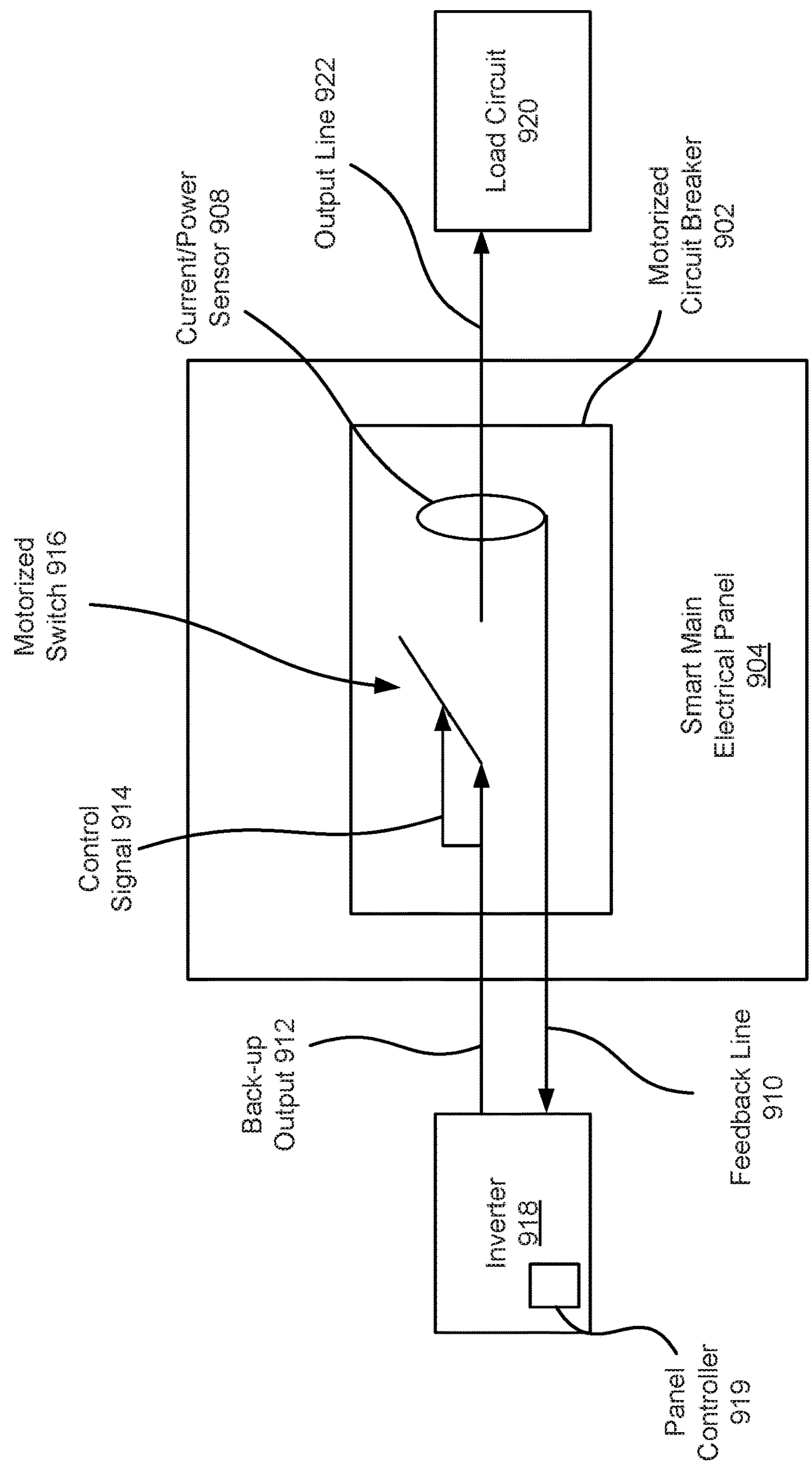
FIG. 9 is a block diagram illustrating an exemplary motorized circuit breaker, according to some embodiments of the present disclosure.

FIG. 9 illustrates a block diagram of exemplary motorized circuit breaker 902, according to embodiments of the present disclosure. Motorized circuit breaker 902 may be any one of motorized circuit breakers 534, 634, 734, and 834 discussed herein with respect to FIGS. 5, 6, 7, and 8, respectively. It is to be appreciated that even though FIG. 9 illustrates only one motorized circuit breaker, one skilled in the art understands that there may be more than one motorized circuit breaker in smart main electrical panel 904, and the description discussed in relation to motorized circuit breaker 902 may apply to some, if not all, of the other motorized circuit breakers. Motorized circuit breaker 902 may be housed within smart main electrical panel 904. In some embodiments, motorized circuit breaker 902 includes a motorized switch 916 for enabling and interrupting power flow. Power flow may be enabled when motorized switch 916 is closed; and power may be interrupted when motorized switch 916 is open.

According to embodiments of the present disclosure, the position of motorized switch 916 may be controlled by control signal 914 that is sent from panel controller 919. As mentioned herein, control signal 914 may be sent via a wired or wireless communication line, e.g., RS232, RS485, CAN, Wi-Fi, Zigbee, Radio frequency, PLC, and the like. Inverter 918 may be any suitable inverter, such as a storage inverter or a hybrid inverter PCS, as discussed herein.

Power provided by inverter 918 may be outputted to motorized switch 916 as back-up output 912. When motorized switch 916 is open, back-up output 912 may not flow to load circuit 920. However, when motorized switch 916 is closed, back-up output 912 may flow to load circuit 920 through output line 922. In some embodiments, current/voltage/power sensor 908 may be positioned along output line 922 between motorized switch 916 and load circuit 920 to monitor power flow to load circuit 920. Measurements made by current/power sensor 908 may be fed back to panel controller 929 as feedback information through feedback line 910. Accordingly, panel controller 919 may measure the usage of power by load circuit 920. In some embodiment, the panel controller may have memory for recording the usage of each specific load circuit and optimize the circuit breaker profile or priority from time to time.

By enabling panel controller 919 to receive feedback information through feedback line 910, panel controller 919 may monitor the usage of power to determine periods of high power usage, periods of low power usage, and time of specific loads usage in a day/month/year. This information may be used to fine tune a priority list, or may be used to determine when a certain circuit breaker profile should be implemented. Accordingly, smart main electrical panel 904 can dynamically change the flow of power from inverter 918 to load circuit 920.

FIG. 9 only shows one motorized circuit breaker 902 and only one load circuit 920 for clarity purposes. It is to be appreciated that embodiments are not limited to such configurations and that other configurations may have more motorized circuit breakers and more load circuits.

Although the invention has been described with respect to specific embodiments, it will be appreciated that the invention is intended to cover all modifications and equivalents within the scope of the following claims.

What is claimed is:

1. An energy generation system, comprising:

an array of photovoltaic (PV) modules for generating direct current (DC) power;

a PV inverter coupled to the array of PV modules, the PV inverter is configured to convert the generated DC power to alternating current (AC) power and output the converted AC power;

a battery pack configured to store DC power and output the stored DC power;

a storage inverter coupled to the battery pack, the storage inverter is configured to convert the outputted stored DC power to AC power and output the converted AC power;

an automatic smart transfer switch configured to select between an AC grid and the storage inverter for outputting to a main electrical panel, wherein the automatic smart transfer switch is configured so that in a first position, the AC grid is coupled to the main electrical panel and the PV inverter is disconnected from the main electrical panel, and in a second position, both the storage inverter is coupled to the main electrical panel; and an AC output line coupled between the storage inverter and the AC grid that bypasses the automatic smart transfer switch.

2. The energy generation system of claim 1, wherein the automatic smart transfer switch is configured to be in the first position when AC power from the AC grid is available, and automatically transfer to the second position in response to a loss of AC power from the AC grid.

3. The energy generation system of claim 1, wherein the automatic smart transfer switch is configured to be in the second position when AC power from the AC grid is available and automatically transfer to the first position in response to a loss of AC power from the AC grid.

4. The energy generation system of claim 3, wherein the automatic smart transfer switch is powered by AC power from the AC grid.

5. The energy generation system of claim 3, wherein the automatic smart transfer switch is powered by AC power from the PV inverter.

6. The energy generation system of claim 1, wherein the automatic smart transfer switch electrically isolates the PV inverter and the storage inverter when the automatic smart transfer switch is in the first position.

7. The energy generation system of claim 1, wherein the main panel includes connections for an entire set of loads at a customer site, wherein the entire set of loads at the customer site includes on-site loads and back-up loads.

8. The energy generation system of claim 1, wherein the automatic smart transfer switch is disconnected from the AC grid when the automatic smart transfer switch is in the second position.

9. The energy generation system of claim 1, further comprising:

a sensor configured to detect a presence of voltage, frequency, or power from the AC grid; and a controller coupled to the sensor and the automatic smart transfer switch.

10. The energy generation system of claim 9, wherein the controller is configured to operate the automatic smart transfer switch in the first position when the sensor detects that power from the AC grid is present and to transition the automatic smart transfer switch to the second position when the sensor detects that power from the AC grid no longer present.

11. An energy generation system, comprising:

an array of photovoltaic (PV) modules for generating direct current (DC) power;

a battery pack configured to store DC power and output the stored DC power;

a hybrid PV inverter power control system (PCS) coupled to the array of PV modules and the battery pack, the hybrid PV inverter is configured to convert the DC power from the array of PV modules and the battery pack to alternating current (AC) power and output the converted AC power;

an automatic smart transfer switch configured to select between an AC grid and the hybrid PV inverter PCS for outputting to a main panel, wherein the automatic smart transfer switch is configured so that in a first position, the AC grid is coupled to the main panel and the PV inverter is disconnected from the main electrical panel, and in a second position, the PV inverter PCS is coupled to the main panel; and an AC output line coupled between the hybrid PV inverter and the AC grid that bypasses the automatic smart transfer switch.

12. The energy generation system of claim 11, wherein the automatic smart transfer switch is configured to be in the first position when AC power from the AC grid is available, and automatically transfer to the second position in response to a loss of AC power from the AC grid.

13. The energy generation system of claim 11, wherein the automatic smart transfer switch is configured to be in the second position when AC power from the AC grid is available, and automatically transfer to the first position in response to a loss of AC power from the AC grid.

14. The energy generation system of claim 13, wherein the automatic smart transfer switch is powered by AC power from the AC grid.

15. The energy generation system of claim 13, wherein the automatic smart transfer switch is powered by AC power from the hybrid PV inverter PCS.

16. The energy generation system of claim 11, wherein the automatic smart transfer switch bypasses the hybrid PV inverter PCS when the automatic smart transfer switch is in the first position.

17. The energy generation system of claim 11, wherein the main panel includes connections for an entire set of loads at a customer site, wherein the entire set of loads at the customer site includes on-site loads and back-up loads.

18. The energy generation system of claim 11, wherein the automatic smart transfer switch is disconnected from the AC grid when the automatic smart transfer switch is in the second position.

19. The energy generation system of claim 11, further comprising:

a sensor configured to detect a presence of voltage, frequency, or power from the AC grid; and a controller coupled to the sensor and the automatic smart transfer switch.

20. The energy generation system of claim 19, wherein the controller is configured to operate the automatic smart transfer switch in the first position when the sensor detects that power from the AC grid is present and to transition the automatic smart transfer switch to the second position when the sensor detects that power from the AC grid no longer present.

* * * * *